United States Patent [19]
Johnson et al.

[11] Patent Number: 5,543,792
[45] Date of Patent: Aug. 6, 1996

[54] METHOD AND APPARATUS TO ENHANCE THE EFFICIENCY OF STORING DIGITIZED ANALOG SIGNALS

[75] Inventors: William J. Johnson, Flower Mound; Guillermo Vegatoro, Grapevine; Larry M. Lachman, Irving, all of Tex.

[73] Assignee: International Business Machines Corporation, Armonk, N.Y.

[21] Appl. No.: 317,949

[22] Filed: Oct. 4, 1994

[51] Int. Cl.$^6$ .................................................. H03M 1/12
[52] U.S. Cl. ............................. 341/123; 341/61; 341/155
[58] Field of Search ..................... 341/61, 87, 122, 341/123, 155

[56] References Cited

U.S. PATENT DOCUMENTS

| | | | |
|---|---|---|---|
| 4,626,827 | 12/1986 | Kitamura et al. | 341/123 |
| 4,763,207 | 8/1988 | Podolak et al. | 360/32 |
| 4,768,017 | 8/1988 | Gordon | 341/123 |
| 4,816,829 | 3/1989 | Podolak et al. | 341/122 |
| 5,119,093 | 6/1992 | Vogt et al. | 341/123 |
| 5,126,737 | 6/1992 | Torii | 341/61 |
| 5,302,950 | 4/1994 | Johnson et al. | 341/123 |

*Primary Examiner*—Marc S. Hoff
*Attorney, Agent, or Firm*—Gunn & Associates, P.C.

[57] ABSTRACT

A sampler develops a digital representation of an analog signal at a predetermined sampling rate. The highest frequency of a period of samples is determined and, if sampling rate of the sampler exceeds the Nyquist rate, indicating oversampling, redundant sample points are discarded from the period and the reduced record is stored. A multiplicity of periods make up a recorded session. To reconstruct the original signal, a common time domain is determined and the reduced records are expanded based upon the common time domain.

7 Claims, 4 Drawing Sheets

METHOD AND APPARATUS TO ENHANCE THE EFFICIENCY OF STORING DIGITIZED ANALOG SIGNALS

FIELD OF THE INVENTION

The present invention relates in general to data processing systems, and in particular to a method of, and apparatus for, reducing the memory space required for the storage of a signal in digital form that was sampled from an analog signal.

BACKGROUND OF THE INVENTION

Conventional data processing systems may provide digital signal processing capabilities for converting an analog signal into digital form. When sampling an analog signal, such as audio, to convert it into digital form for storage, the number of samples taken per second (sampling rate) determines the quality of the signal that is generated when the digital signal is converted back to an analog form. According to the Nyquist Theorem, a band-limited analog signal, $x(t)$, can be reconstructed from its sample values, $x(nT)$, if the sampling rate, $1/T$, is greater than twice the highest frequency, $f$, present in $x(t)$. The sampling rate, $2*f$, is referred to as the Nyquist rate.

The sampling rate in a conventional data processing system is either determined by the designer or is left to the user to decide. If a sampling rate smaller than the Nyquist rate is chosen (under sampling), information will be lost from the original analog signal, decreasing the fidelity of the digital signal when it is played back. Over sampling (selecting a sampling rate much higher than the Nyquist rate), on the other hand, will cause the sampling rate of the sampled signal to be larger than what is needed to reconstruct the signal from its samples, thus wasting valuable storage space. Conventional systems do not determine the Nyquist rate of the analog signal, and thus cannot prevent the information loss caused by under sampling or the storage waste caused by over sampling. This problem is compounded in a multimedia data processing system which may be converting multiple analog signals, all with differing Nyquist rates.

Prior to U.S. Pat. No. 5,302,950 entitled Method of and Apparatus For Providing Automatic Determination of Information Sampling Rate, invented by the same inventors and assigned to the same assignee as the present invention and incorporated herein by reference, the prior art approaches presented the user with seven difficulties. The first difficulty was that the prior art approaches did not automatically determine the Nyquist rate of an analog signal. The second difficulty was that the prior art approaches did not automatically determine a sampling rate for an analog signal based on the analog signal's Nyquist rate. The third difficulty was that the prior art approaches did not inform a user that a loss of information due to under sampling may occur. The fourth difficulty was that the prior art approaches did not inform a user that a waste of storage due to over sampling may occur. The fifth difficulty was that the prior art approaches did not provide a user a choice of alternative actions when such a loss of information or a waste of storage may occur. The sixth difficulty was that the prior art approaches did not adjust a sampling rate to prevent either a loss of information or a waste of storage. The seventh difficulty was that the prior art approaches did not adjust a sampling rate to available storage.

The previously mentioned U.S. Pat. No. 5,302,950 solved these difficulties by (1) determining a highest frequency component of an analog signal; (2) calculating a Nyquist rate responsive to the highest frequency component; (3) altering a sampling rate responsive to the Nyquist rate by informing a user that the sampling rate and the Nyquist rate were not equal and allowing the user to select an appropriate action wherein (4) the sampling rate is determined automatically by a size of a user specified storage repository. Thus, the invention of the '950 patent solved the seven and other problems of the prior art by attacking the first part of the process of sampling and storing an analog signal. The sampling rate was modified to accommodate the highest determined frequency so that no information was lost and to accommodate available memory space.

Often it is difficult to determine how best to sample an audio signal, particularly when storage resources are limited and frequency range of the audio information is not known. An efficient method for sampling audio information is therefore needed when variables governing sample size are not known.

Another problem in storage efficiency arises when sound to be digitally recorded varies from very low frequencies to very high frequencies, particularly out of the range of human hearing. Sampling the audio signal must be performed according to the highest frequency in an entire recording session to ensure all sound is captured. A method which allows dynamically changing the sampling rate during a session for the purpose of not over-sampling is needed. Excessive sampling wastes storage by having duplicated or redundant information within a time interval.

SUMMARY OF THE INVENTION

The present invention enables minimizing storage requirements of sampled audio information through a double buffered technique which produces lists of stored information records.

A comprehensive sampler comprising a spectrum analyzer samples an audio signal at a worst case sample rate such that all information is captured. For example, for an audio signal with an expected maximum frequency of, say, 20 KHz, the sampling rate is ideally set at 40 KHz or more. Samples so taken are stored, one buffer at a time. As a buffer is filled, it is placed into a FIFO queue. The only responsibility of the comprehensive sampler is collecting digitized audio information and placing elements (buffers of digitized audio along with the maximum frequency associated with the buffer) into the FIFO queue one at a time until such time that audio sampling is complete.

Asynchronously, a sample reducer examines and removes elements from the queue, one at a time in FIFO order. The sample reducer examines an entry for the maximum frequency within that entry or element. After retrieving the maximum frequency, the element is re-sampled from the digitized form according to the Nyquist theorem so that only the required sampling rate is used in the final version of the element that is actually stored.

The sample reducer then adds the element to a storage file as a variably sized record. Each record contains control information and the sampled digital data. The control information comprises at least the sample rate used and the number of samples. The unit of time is constant throughout the various processes of the present invention.

For example, if the comprehensive sampler samples at 1000 samples per second and the maximum frequency of a queue element output by the comprehensive sampler is 250 samples per second, then the sample rate is 2×250=500 samples per second. Thus, the sample reducer can reduce the queue element by half the size because the maximum sampling rate is effectively halved by this technique. If no frequency is detected in a queue element (i.e., no sound), a record is created with control data and no sampled data. The sample reducer is capable of eliminating fruitless sampling completely.

The sample rate is also later used to determine a common denominator among all records in the sample reducer output file before reconstructing the analog signal. Records in the reduced sample file differ in size and finalized sampling rate. The sampling rate is derived by ensuring duplicated data is avoided across an entire segmented sample (i.e., sample element). When a sampling session is complete, the resulting reduced sample file contains records in contiguous order where records differ in size and control data.

The size of each reduced sample file record is needed so that the file can be correctly parsed when required to produce the order of elements in the file starting from the beginning of the file. Size can be determined by knowing the number of bytes for storing control information and the number of samples in the record. Reconstructing sound or other analog signal from the internalized form stored in the digitized file is performed by determining the least common multiple (LCM) sampling rate among all records followed by expanding each record to the determined LCM.

The present invention has the advantage of providing a method of improving the storage and reconstruction of audio signals in data processing systems.

The present invention has the further advantage of ensuring the capture of all of the information in an analog record while eliminating redundant data in the record.

The present invention has the further advantage of storing digitized samples of an analog signal "on the fly" while asynchronously and simultaneously storing the digital signal in reduced form.

The present invention has the further advantage of permitting the reconstruction of the reduced sample files without losing any information from the original sample.

BRIEF DESCRIPTION OF THE DRAWINGS

For a more complete understanding of the present invention and the features and advantages thereof, reference is now made to the Detailed Description in conjunction with the attached Drawings, in which.

DETAILED DESCRIPTION OF A PREFERRED EMBODIMENT

Figure 1:
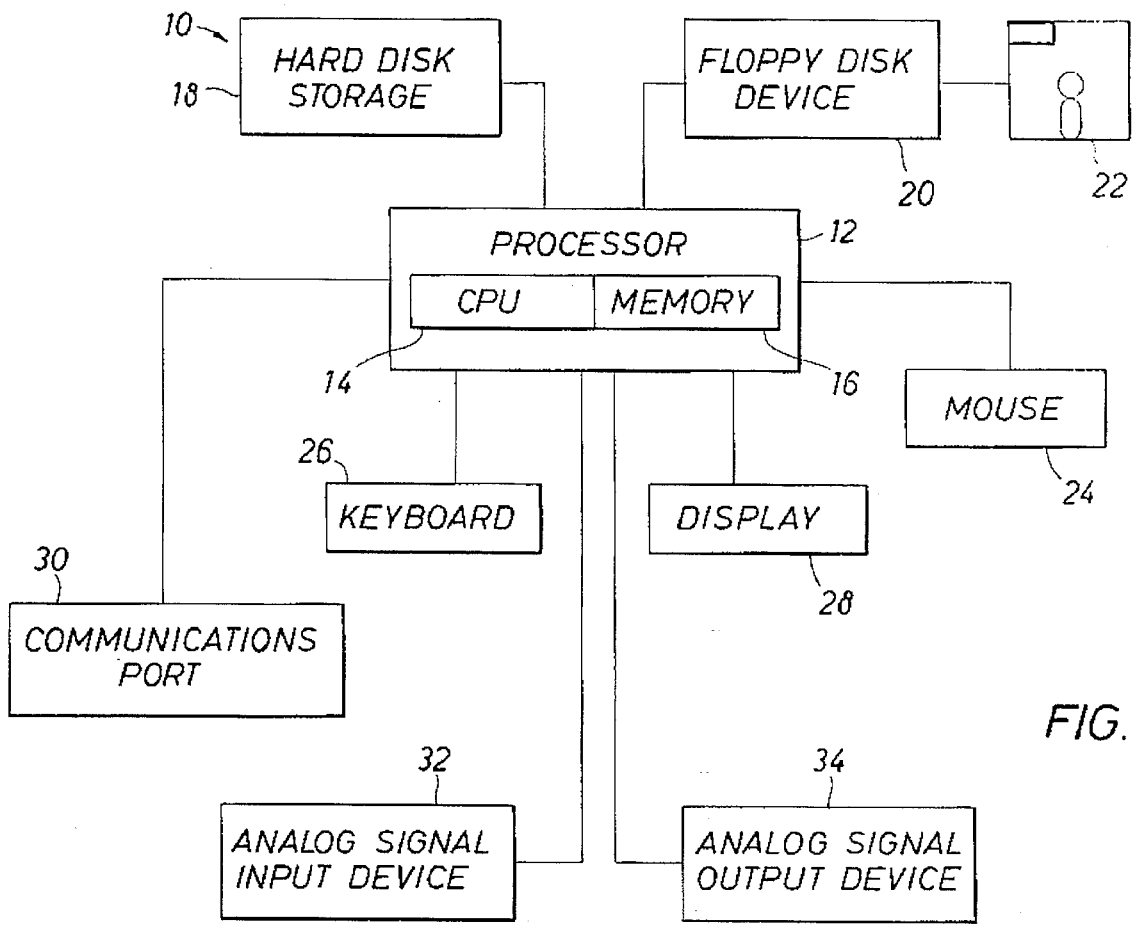
FIG. 1 is a block diagram of a data processing system used in performing the method of the present invention and forming part of the apparatus of the present invention.

First, FIG. 1 depicts a block diagram of a data processing system 10 wherein the present invention finds useful application. The data processing system 10 includes a processor 12, which includes a central processing unit (CPU) 14 and a memory 16. Additional memory, in the form of a hard disk file storage 18 and a floppy disk device 20, is connected to the processor 12. Floppy disk device 20 receives a diskette 22 which has computer program code recorded thereon that implements the present invention in the data processing system 10. The data processing system 10 may include user interface hardware, including a mouse 24 and a keyboard 26 to allow a user access to the processor 12 and a display 28 for presenting visual data to the user. The data processing system 10 may also include a communications port 30 for communicating with a network or other data processing systems. The data processing system 10 may also include analog signal devices, including an analog signal input device 32 for entering analog signals into the data processing system 10, and an analog signal output device 34 for reproducing analog signals.

Figure 3:
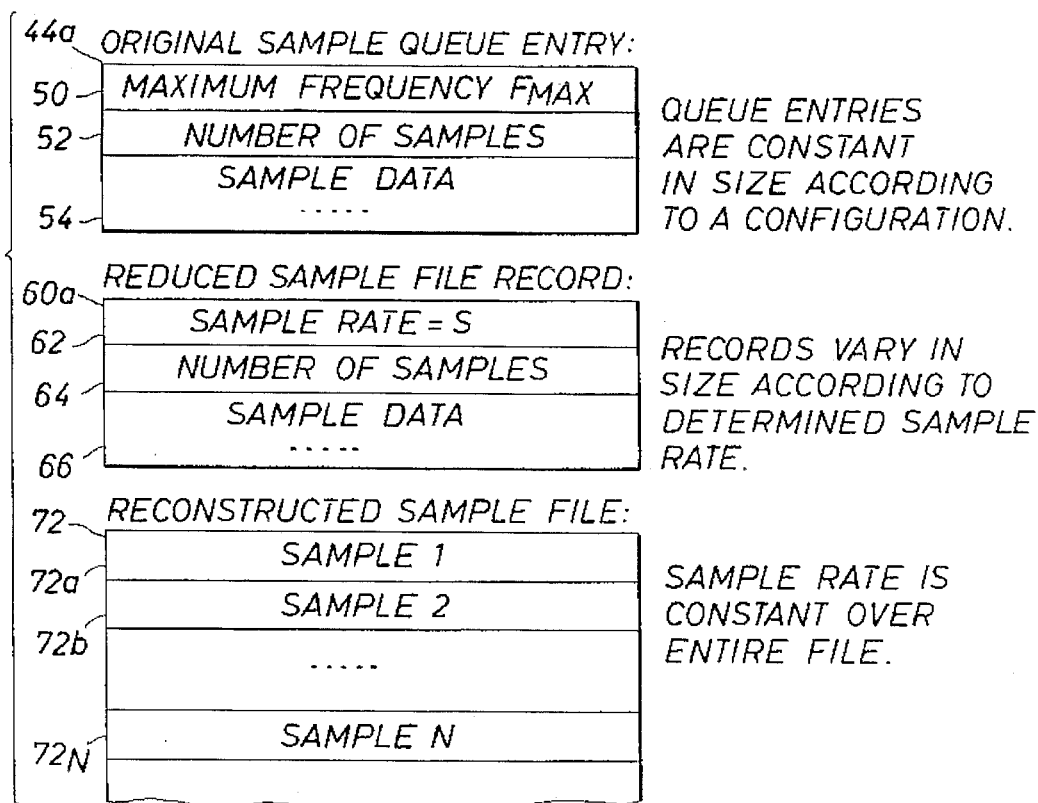
FIG. 3 is a block diagram of a bit map illustrating the signal development by the elements of FIG. 2.
Figure 2:
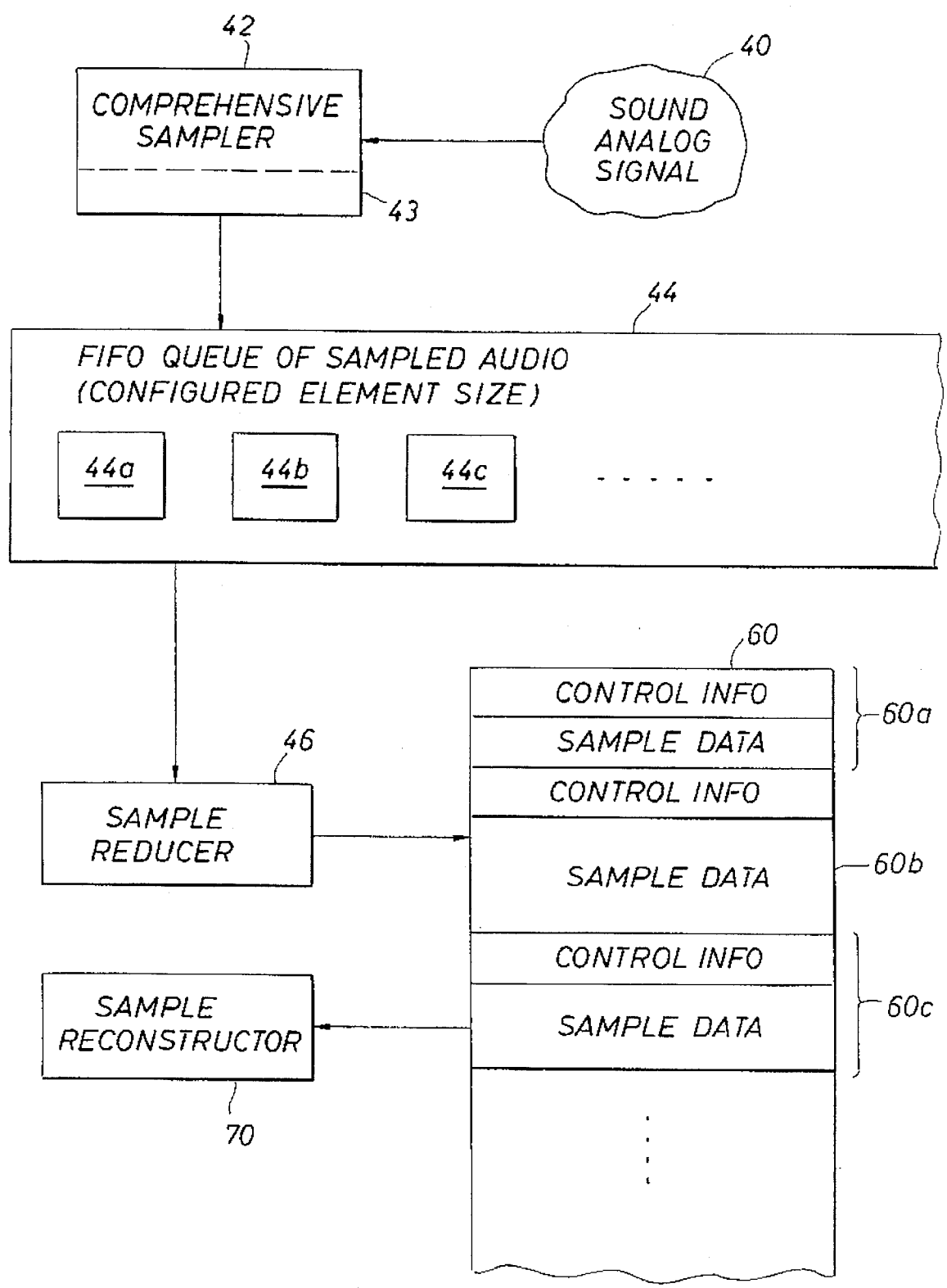
FIG. 2 is a block diagram of a system incorporating the present invention including means for sampling an analog signal, reducing the bits to be stored that represent the sampled signal, and reconstructing the signal from the reduced representation.

Referring now to FIGS. 2 and 3 simultaneously, an analog signal 40, which may represent sound for example, is developed from some source. The analog signal is detected and sampled by a comprehensive sampler 42 at a predetermined sampling rate $S_{SA}$. The sampler 42 provides a digital signal to a memory 44 which represents a FIFO register or queue. The comprehensive sampler also may include a means 43 of detecting the highest frequency component for each sample portion read into the memory 44. The means 43 of detecting the highest frequency component may alternatively be a separate element apart from the spectrum analyzer of the sampler 42. The memory 44 may also be referred to as the "Original Sample Queue" since the data entered therein is the unaltered original digital sample. The original sample is sequentially and periodically read into individual sample queue entry elements 44a, 44b, 44c, etc. It should be appreciated that this operation is conducted "on the fly" since, as samples are read into the entry elements 44a, 44b, 44c, etc., the oldest of these samples is also being read out for further manipulation by a sample reducer 46 as explained in further detail with regard to FIGS. 4 and 5.

FIG. 3 shows one such original sample queue entry element 44a. Each original sample queue entry in the memory 44 is the same length, based only upon the configuration of the system. Each entry element, for example element 44a, includes three fields, a Maximum Frequency field 50, a Number of Samples field 52, and a Sample Data field 54. The value that is placed in the Maximum Frequency field 50 is the highest frequency determined and forwarded by the comprehensive sample 42 and is the highest frequency of the analog signal during one sample period. The value that is placed in the Number of Samples field 52 is also obtained from the Comprehensive sampler and is a function of the sampling rate of the sampler 42 during that sampling period. Finally, the Sample Data field 54 contains the digital representation of the analog signal during that sampling period.

While entries are being read into the memory 44, the sample reducer 46 begins and continues to read out the entries 44a, 44b, etc. Effectively, the sample reducer 46 eliminates redundant data points from the Sample Data field 54, thereby reducing the number of bits of information passed along to a reduced sample file 60. The process carried out by the sample reducer 46 is described in further detail with regard to FIG. 4.

The reduced samples from the sample reducer are written sequentially into the sample file 60, each sample into a variable length reduced sample file record 60a, 60b, or 60c, etc. As shown in FIG. 2, the reduced sample file record 60a occupies less memory space than the reduced sample file record 60b because more redundant data has been eliminated by the sample reducer 46. The records 60a, 60b, 60c, etc. comprise certain control information and the reduced sample data. As shown in FIG. 3, the control information includes a Sample Rate field 62, a Number of Samples field 64, and a Sample Data field 66. The value, S, that is stored in the Sample Rate field is calculated by the sample reducer 46 in a manner described below with regard to FIG. 4. The number that is stored in the Number of Samples field is copied from a corresponding Number of Samples field 52 in the memory 44. The Sample Data field is the data from Sample Data field 54 reduced by a factor of $S_{SA÷}S$, as shown in FIG. 4.

Figure 5:
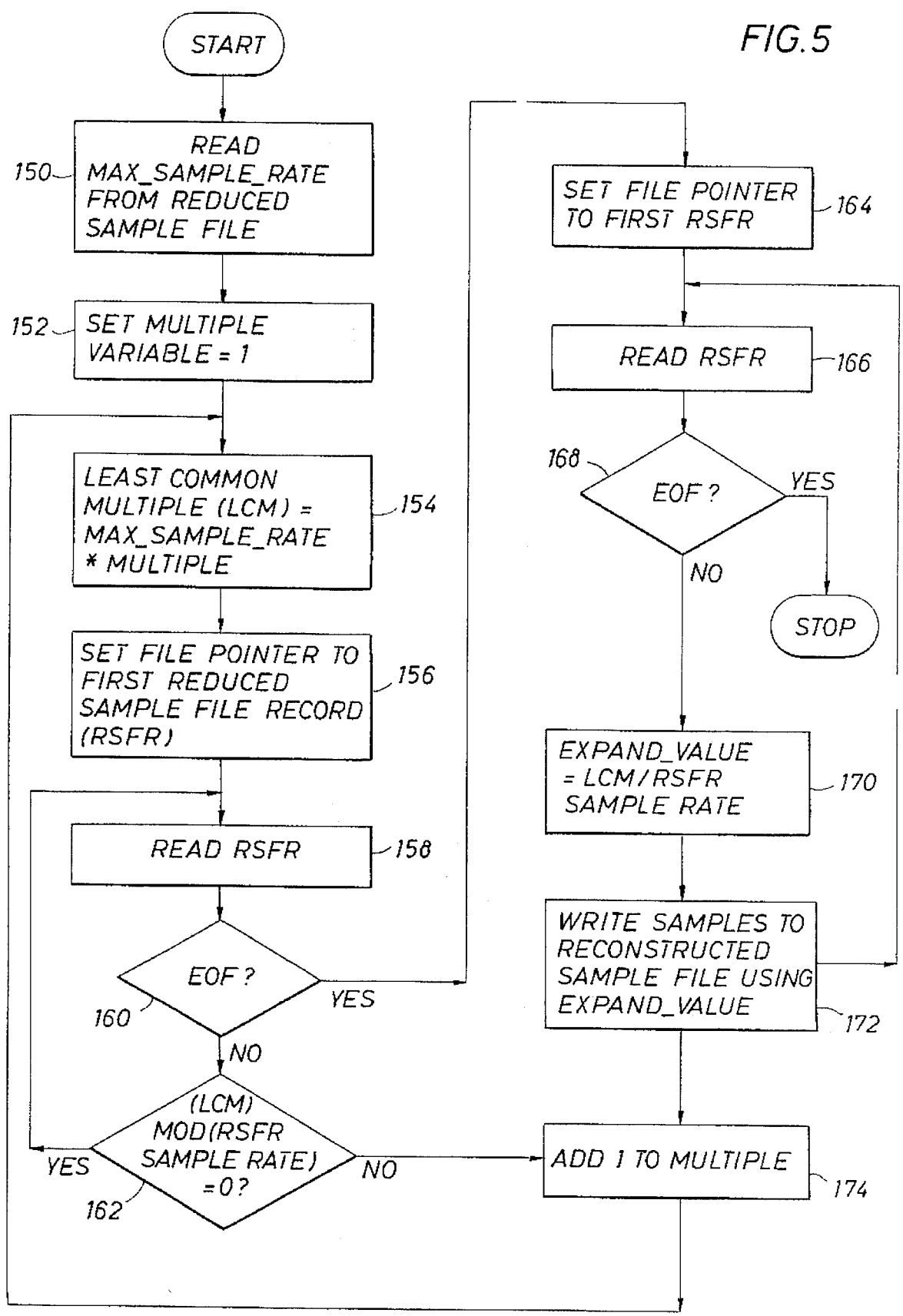
FIG. 5 is a flow chart illustrating the operations preferred in carrying out the present invention to reconstruct the signal reduced by the operation of FIG. 4.

When the analog signal is to be reconstructed, as in the method shown in FIG. 5, a sample reconstructor 70 reads information from the reduced sample file 60, reconstructs the samples, and stores the reconstructed samples in a reconstructed sample file 72 (FIG. 3). The reconstructed samples are thereby restored with a common time base, and consequently the entries $72a, 72b, \ldots 72_N$ etc. in the reconstructed sample file all have the same length. The file is thus available for the production of the original analog signal, such as for example, the production of sound through the use of known digital audio technology.

Figure 4:
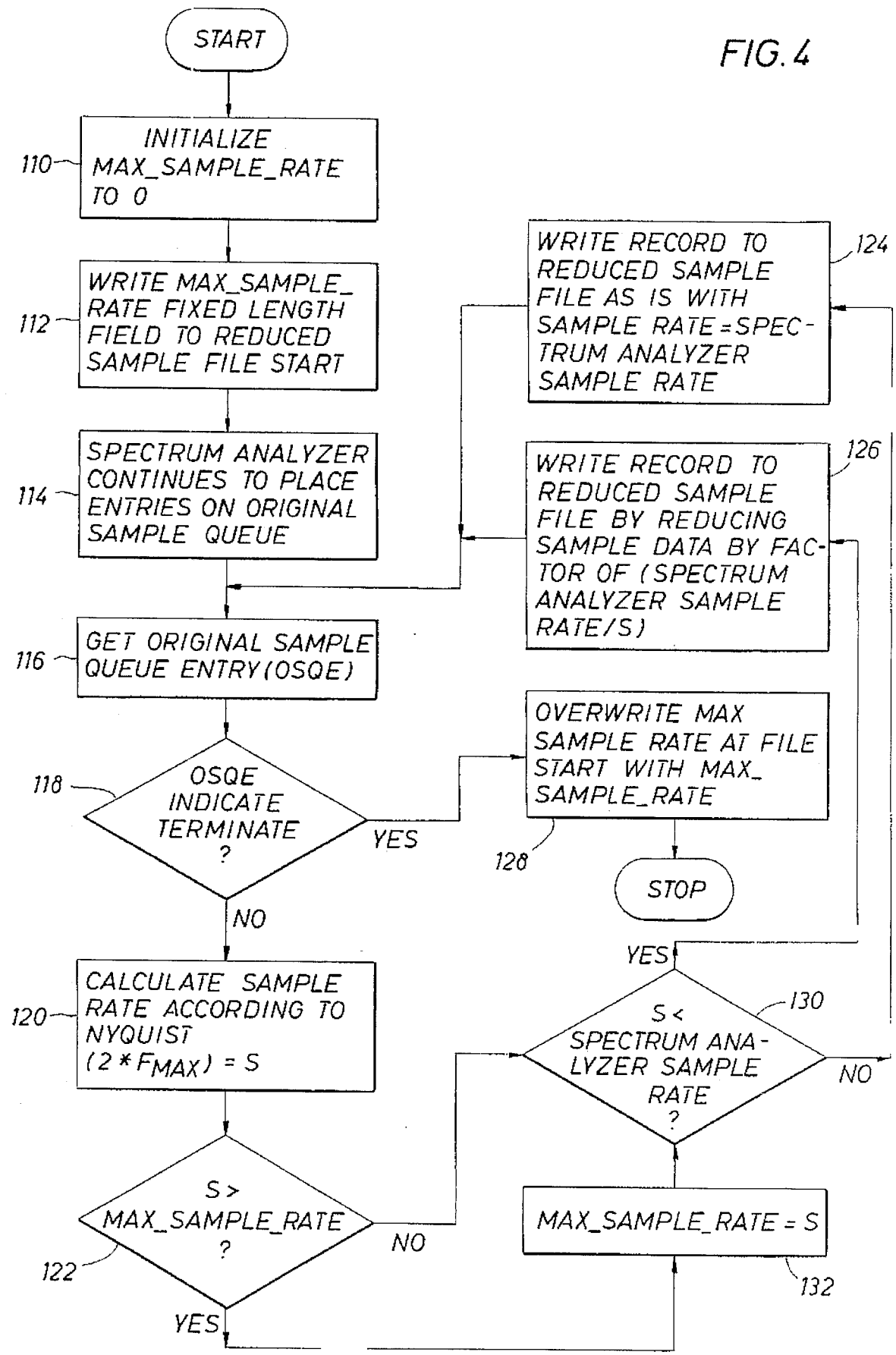
FIG. 4 is a flow chart illustrating the operations preferred in carrying out the present invention to reduce the number of bits to be stored representing a signal.

FIG. 4 is a logic flow diagram illustrating the preferred method of reducing the original samples in the sample reducer 46. After the START of the program, a register designated the MAX_SAMPLE_RATE register is initialized to 0 in step 110. In step 112, the fixed length field of the MAX_SAMPLE_RATE is written to the start of the max sample rate is written to the start of the reduced sample file, (step 150), which is also an initialization step. This value will be finally determined at the conclusion of the reduction process of FIG. 4.

Next, as previously mentioned, the comprehensive sampler, operating asynchronously, continues to write entries into the memory 44 while the sample reducer performs the reduction function. This feature is shown in step 114.

As the sample reducer 46 begins the reduction process, the next available entry (i.e., the Original Sample Queue Entry or OSQE) in the FIFO queue of the memory 44 is retrieved. When all original samples have been processed, processing is complete. Thus, a decision block 118 determines if the OSQE indicates that the reduction process is to terminate. If not, the process continues with calculation step 120.

Recall from FIG. 3 that the OSQE includes three fields: (1) $F_{max}$ 50; (2) Number of Samples 52; and (3) Sample Data 54. The calculation step 120 reads the $F_{max}$ field and calculates the sample rate S by doubling Fmax. In decision block 122, if the calculated sample rate S is greater than the value in the MAX_SAMPLE_RATE register, then the branch to step 132 resets the MAX_SAMPLE_RATE register to S. If S is not greater than MAX_SAMPLE_RATE (or after resetting MAX_SAMPLE_RATE to S in step 132), the process continues with decision step 130.

Decision step 130 is the point in the process at which a determination is made whether or not to reduce the sample data from the Sample Data field 54 before storing in the Sample Data field 66 in the reduced sample file record. If the calculated sample rate as determined from the Nyquist theorem is less than the sampling rate of the comprehensive sampler 42, then the data is appropriately reduced in step 126. If not, then the original sample data is stored during step 124 with $S=S_{SA}$. If the data is to be reduced in step 126, then sample data is reduced by a factor of $S_{SA÷}S$. For example, if the comprehensive sampler 42 operates at three times the Nyquist rate of the signal in the OSQE, then only every third data point will be selected for storage with the reduced sample file.

When the reduced sample file record has been stored by step 126 or step 124, the process returns to step 116 to read the next available OSQE. If the last entry has already been read, the process continues with step 128. Here, the last update of MAX_SAMPLE_RATE is overwritten at the start of the file so that this value is available for the reconstruction process of FIG. 5. The storage of the reduced data file is then complete.

FIG. 5 depicts the steps necessary to restore the reduced data samples to a common time base. This is done by expanding each record in the memory 60 by the same factor, or less, as it was previously reduced. A reconstructed sample file 72 sample rate is always equal or less than the rate used by the comprehensive sampler 42.

To restore the reduced file to a constant sample rate, the process of FIG. 5 begins with step 150 by reading the MAX_SAMPLE_RATE that was recorded in step 128. In another initialization step, a register designated as MULTIPLE is initialized to 1. With these two values, a Least Common Multiple (LCM) is calculated in step 154 by multiplying MAX_SAMPLE_RATE by MULTIPLE. Then, step 156 sets a file pointer to the first Reduced Sample File Record (RSFR) 60a. Next begins an iterative process to determine the least common multiple for all of the samples 60a, 60b, etc. In step 158, the RSFR is read and if the data indicates that the end of the file has been reached by step 160, the restoration process continues with step 164. If valid data is stored at the location of the pointer, step 162 determines if the RSFR sample rate divides into the LCM with no remainder. If it does, the process continues by reading the next file record and processing continues as previously described until the end of the file has been reached. If the RSFR sample rate divides into the LCM with a remainder, then the MULTIPLE register is incremented by one in step 174, and the process continues with step 154.

This iteration, the LCM is set to MAX_SAMPLE_RATE times two. Subsequent iterations of step 174 allow step 154 to set a new trial LCM for the current iteration. The file pointer is reset to the first record and the process is continued until the LCM for every RSFR in the entire reduced sample file record has been determined.

The pointer is then reset to the first reduced sample file record 60a. Now begins another iterative process of reconstructing each of the reduced samples. First, the RSFR is read in step 166 and, if determined by step 168 the end of file has been reached, the process is complete. If valid data is stored in the record, step 170 calculates a value designated the EXPAND_VALUE register that is the LCM÷ sample rate in field 62 for that record. This value is used to produce samples stored in the Reconstructed Sample File 72 and the sample now has a time domain which will be consistent with all other samples in the resulting Reconstructed Sample File. The process continues with step 166 by reading the next RSFR 60b, reconstructing the samples as before, and continuing until all of the reduced samples have been reconstructed.

The foregoing technique significantly reduces the memory space required to store digitized samples of analog signals, particularly when the predetermined sample rate is set to accommodate the highest anticipated frequency in the signal, which is seldom present in the samples actually taken. Furthermore, the technique just described is broadly applicable to analog signals in general, but has been found to be particularly useful in the recordation of high fidelity sound throughout the range of human hearing and beyond.

The principles, preferred embodiment, and mode of operation of the present invention have been described in the foregoing specification. This invention is not to be construed as limited to the particular forms disclosed, since these are regarded as illustrative rather than restrictive. Moreover, variations and changes may be made by those skilled in the art without departing from the spirit of the invention.

We claim:

1. A method of analog to digital conversion of an analog signal comprising the steps of:
   a. sampling an analog signal at a predetermined sampling rate as a digital signal comprising a plurality of data bits;
   b. temporarily storing the samples from step a. as digital elements of common length;
   c. eliminating redundant data bits from the digital elements of step b. to form reduced sample file records of variable length; and
   d. storing the reduced sample file records formed in step c.

2. The method of claim 1 wherein the step of eliminating redundant data bits is accomplished by:
   a. determining the maximum frequency within a digital element;
   b. calculating the Nyquist rate for the digital element; and
   c. if the rate of sampling the analog signal is greater than the Nyquist rate, reducing the bits in the digital element by a factor of the rate of sampling the analog signal ÷ the Nyquist rate.

3. The method of claim 1 further comprising the step of reconstructing reduced sample file records by restoring the records to a common time domain.

4. A system for converting an analog signal to digital form comprising:
   a. sampler having a predetermined sampling rate for taking samples of an analog signal;
   b. buffer memory for temporarily storing the samples from step a. in digital form;
   c. FIFO queue for receiving the samples in digital form from step b., the FIFO queue storing the samples as original sample queue entries, each of the original sample queue entries comprising a plurality of data bits;
   d. means for determining a highest frequency component for each of the original sample queue entries;
   e. means for calculating a Nyquist rate responsive to the highest frequency component for each of the original sample queue entries;
   f. means for reducing the number of data bits in each of the original sample queue entries based upon the frequency determined in step d. and the Nyquist calculated in step e. to produce a reduced sample file record; and
   g. means for storing the reduced sample file record.

5. The system of claim 4 further comprising a sample reconstructor to restore the reduced sample file record to an original sample queue entry responsive to the reduction of the original sample queue entries.

6. A system for converting an analog signal to digital form comprising:
   a. a comprehensive sampler comprising a spectrum analyzer to receive an analog signal and to develop a plurality of original digital samples corresponding to the analog signal;
   b. means for determining the presence of redundant portions in each of said original digital samples, said means further comprising means for discarding redundant portions of each of said original digital samples to develop a plurality of reduced sample file records; and
   c. memory for receiving and storing the reduced sample file records.

7. The system of claim 6 further comprising means for reconstructing each said original digital samples by restoring the discarded portions corresponding to each of the reduced sample file records.

* * * * *